United States Patent
Lee et al.

(10) Patent No.: US 7,452,807 B2
(45) Date of Patent: Nov. 18, 2008

(54) METHOD OF FORMING A METAL WIRING IN A SEMICONDUCTOR DEVICE

(75) Inventors: Yong-Woo Lee, Anyang-si (KR); Jae-Seung Hwang, Suwon-si (KR); Dae-Hyun Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 324 days.

(21) Appl. No.: 11/475,166

(22) Filed: Jun. 27, 2006

(65) Prior Publication Data

US 2007/0006451 A1    Jan. 11, 2007

(30) Foreign Application Priority Data

Jul. 5, 2005    (KR) .................. 10-2005-0060030

(51) Int. Cl.
*H01L 21/44* (2006.01)

(52) U.S. Cl. .................. 438/653; 438/656; 438/671; 438/685; 257/E21.579

(58) Field of Classification Search .................. 438/653, 438/656, 671, 684, 685; 257/E21.579, E21.252
See application file for complete search history.

(56) References Cited

U.S. PATENT DOCUMENTS

| | | | |
|---|---|---|---|
| 6,767,825 B1 * | 7/2004 | Wu .................. | 438/633 |
| 6,927,161 B2 * | 8/2005 | Ruelke et al. .................. | 438/637 |
| 7,071,100 B2 * | 7/2006 | Chen et al. .................. | 438/643 |
| 7,378,343 B2 * | 5/2008 | Chen et al. .................. | 438/638 |
| 2005/0067710 A1 * | 3/2005 | Lytle et al. .................. | 257/774 |
| 2007/0190718 A1 * | 8/2007 | Coolbaugh et al. .................. | 438/253 |

FOREIGN PATENT DOCUMENTS

| | | |
|---|---|---|
| JP | 08-181146 | 7/1996 |
| JP | 2001-358145 | 12/2001 |
| KR | 1997-48996 | 7/1997 |

* cited by examiner

*Primary Examiner*—Scott B. Geyer
*Assistant Examiner*—Seahvosh J Nikmanesh
(74) *Attorney, Agent, or Firm*—Harness, Dickey & Pierce, P.L.C.

(57) ABSTRACT

Example embodiments of the present invention relate to a method of forming a metal wiring in a semiconductor device. Other example embodiments of the present invention relate to a method of forming a metal wiring in a semiconductor device without a generation of a bridge between adjacent metal wirings. In a method of forming a metal wiring in a semiconductor device, at least one metal layer and at least one barrier layer may be sequentially formed on a substrate. A metal blocking layer may be formed on the at least one barrier metal layer. A hard mask layer may be formed on the metal blocking layer. A hard mask pattern may be formed on the metal blocking layer by etching the hard mask layer without an exposure of the at least one barrier metal layer. A metal blocking layer pattern may be formed on the at least one barrier metal layer by etching the metal blocking layer using the hard mask pattern as an etching mask. The metal wiring having at least one metal layer pattern and at least one barrier metal layer pattern may be formed on the substrate by etching the at least one barrier metal layer and the at least one metal layer using the hard mask pattern as an etching mask. The metal wiring having a reduced width may be obtained without a failure (e.g., a bridge).

20 Claims, 5 Drawing Sheets

METHOD OF FORMING A METAL WIRING IN A SEMICONDUCTOR DEVICE

PRIORITY STATEMENT

This application claims priority under 35 USC § 119 to Korean Patent Application No. 2005-60030 filed on Jul. 5, 2005, in the Korean Intellectual Property Office (KIPO), the entire contents of which are incorporated herein by reference.

BACKGROUND

1. Field of the Invention

Example embodiments of the present invention relate to a method of forming a metal wiring in a semiconductor device. Other example embodiments of the present invention relate to a method of forming a metal wiring in a semiconductor device without a generation of a bridge between adjacent metal wirings.

2. Description of the Related Art

As information process apparatuses (e.g., computers) have become more widely used, semiconductor devices, employed in the information process apparatuses, have also been rapidly developed to have higher response speed and larger storage capacity. In semiconductor manufacturing technology, the integration degree, the reliability and the response speed of the semiconductor device have improved.

A metal wiring in a semiconductor device may have a reduced width in accordance with an increase in the integration degree of the semiconductor device. When the metal wiring has a reduced width, the metal wiring may not be properly formed without the generation of a failure (e.g., a bridge) between adjacent metal wirings. Further, the metal wiring in the highly integrated semiconductor device may have a higher electrical conductivity so that the metal wiring may be formed using a material having a lower specific resistance. The metal wiring employed in the semiconductor device may be formed using aluminum (Al), tungsten (W) and/or copper (Cu). Because aluminum has a specific resistance lower than that of tungsten and a metal pattern of aluminum may be more easily formed by a dry etching process in comparison with a metal pattern of copper, a contact plug and/or a conductive wiring of a current semiconductor device may be formed using aluminum.

In a conventional method of forming the metal wiring of a semiconductor device, an aluminum layer, a barrier metal layer and a mask layer may be formed on a substrate, and then, a resist pattern may be formed on the mask layer. The mask layer may be partially etched using the resist pattern so that a mask pattern is formed on the barrier metal layer. The barrier layer and the aluminum layer may be partially etched using the mask pattern to thereby form the metal wiring on the substrate.

FIGS. 1 and 2 are diagrams illustrating a conventional method of forming a metal wiring. Referring to FIG. 1, after an insulation interlayer 20 is formed on a substrate 10, an aluminum layer 22 and a barrier metal layer 24 may be successively formed on the insulating interlayer 20. A mask layer may be formed on the barrier metal layer 24. After a photoresist pattern 28 is formed on the mask layer, a mask pattern 26 may be formed on the barrier metal layer 24 using the photoresist pattern 28 as an etching mask.

When the mask pattern 26 is formed using the photoresist pattern 28, the barrier metal layer 24 and/or the aluminum layer 22 may be partially exposed so that polymers 29 generated in the etching process may be attached to a sidewall of the mask pattern 26 and the exposed portion of the barrier metal layer 24. The polymers 29 may be generated when the mask pattern 26 is formed using a photoresist pattern that may react relative to a light having a small wavelength for a smaller pattern.

When the polymers 29 are attached to the sidewall of the mask pattern 26 and the barrier metal layer 24, the aluminum layer 22 may not be properly etched due to the polymers 29. A bridge B as shown in FIG. 2 may be formed between adjacent metal wirings 25 after the formation of the metal wiring 25 having an aluminum layer pattern 22a and a barrier metal layer pattern 24a. This bridge B may cause an electrical failure, for example, an electrical short between the adjacent metal wirings 25.

SUMMARY

Example embodiments of the present invention relate to a method of forming a metal wiring in a semiconductor device. Other example embodiments of the present invention relate to a method of forming a metal wiring in a semiconductor device without a generation of a bridge between adjacent metal wirings.

According to example embodiments of the present invention, there is provided a method of forming a metal wiring in a semiconductor device. In the method of forming the metal wiring in the semiconductor device, after at least one metal layer may be formed on a substrate, at least one barrier metal layer may be formed on the at least one metal layer. A metal blocking layer may be formed on the at least one barrier metal layer and then a hard mask layer may be formed on the metal blocking layer. A hard mask pattern may be formed on the metal blocking layer by etching the hard mask layer without exposing the at least one barrier metal layer. A metal blocking layer pattern may be formed on the at least one barrier metal layer by etching the metal blocking layer using the hard mask pattern as an etching mask. The metal wiring having at least one metal layer pattern and at least one barrier metal layer pattern may be formed on the substrate by etching the at least one barrier metal layer and the at least one metal layer using the hard mask pattern as an etching mask.

In example embodiments of the present invention, the hard mask pattern may be formed by forming a photoresist pattern on the hard mask layer and etching the hard mask layer using the photoresist pattern as an etching mask. In example embodiments of the present invention, the photoresist pattern may be removed from the hard mask pattern before the formation of the metal blocking layer pattern. In example embodiments of the present invention, the photoresist pattern may be formed using a photoresist that may react with respect to a light having a wavelength below about 193 nm.

In example embodiments of the present invention, the hard mask pattern may be formed by detecting an end point of etching the hard mask layer using a wavelength difference between a light reflected from the hard mask layer and a light reflected from the metal blocking layer. In example embodiments of the present invention, the hard mask pattern may be formed using an etching gas that may have an etching selectivity of about 5:1 between the hard mask layer and the metal blocking layer. For example, the etching gas may include $C_4F_6$, $C_5F_8$, $C_4F_8$ and/or $CHF_3$. These may be used alone or in a mixture thereof. In example embodiments of the present invention, the hard mask pattern and the metal blocking layer pattern may be removed after the formation of the metal wiring.

In example embodiments of the present invention, the metal blocking layer may be formed using a first material and the hard mask layer may be formed using a second material different from the first material. For example, the first material and the second material independently may include silicon oxide, silicon nitride, silicon oxynitride and/or polysilicon. In example embodiments of the present invention, the at least one metal layer may be formed using aluminum, tungsten and/or copper.

In example embodiments of the present invention, the at least one barrier metal layer may be formed using titanium, tantalum, titanium nitride and/or tantalum nitride. These may be used alone or in a mixture thereof. In example embodiments of the present invention, an additional barrier metal layer may be formed on the substrate prior to the formation of the at least one metal layer. The additional barrier metal layer may be formed using titanium, tantalum, titanium nitride and/or tantalum nitride. These may be used alone or in a mixture thereof. In example embodiments of the present invention, an isolation layer may be formed on the substrate and then a contact may be formed through the isolation layer prior to the formation of the at least one metal layer.

According to other example embodiments of the present invention, there is provided a method of forming a metal wiring in a semiconductor device. In the method of forming the metal wiring in the semiconductor device, at least one metal layer and at least one barrier metal layer may be sequentially formed on a substrate. After a hard mask layer is formed on the at least one barrier metal layer, a photoresist pattern may be formed on the hard mask layer. A preliminary hard mask pattern may be formed on the at least one barrier metal layer. The preliminary hard mask pattern may cover the at least one barrier metal layer. A hard mask pattern may be formed on the at least one barrier metal layer by partially etching the preliminary hard mask pattern. The metal wiring may be formed on the substrate by partially etching the at least one barrier metal layer and the at least one metal layer using the hard mask pattern as an etching mask.

In example embodiments of the present invention, the photoresist pattern may be removed from the preliminary hard mask pattern prior to the formation of the hard mask pattern. In example embodiments of the present invention, the hard mask layer may be formed using a material that may have an etching selectivity relative to the at least one metal layer. For example, the at least one metal layer may be formed using aluminum, tungsten and/or copper, whereas the hard mask layer may be formed using silicon oxide, silicon nitride, silicon oxynitride and/or polysilicon. In example embodiments of the present invention, the photoresist pattern may be formed using photoresist that may react with respect to a light having a wavelength of below about 193 nm.

According to example embodiments of the present invention, a failure (e.g., a bridge) frequently generated between adjacent metal wirings may be effectively reduced by retarding, or preventing, the reaction between etched by-products and at least one barrier metal layer. The metal wiring having a reduced width may be obtained without a failure thereof. A semiconductor device may have improved reliability and electrical characteristics when the metal wiring, according to example embodiments of the present invention, is employed in the semiconductor device.

BRIEF DESCRIPTION OF THE DRAWINGS

Example embodiments of the present invention will be more clearly understood from the following detailed description taken in conjunction with the accompanying drawings.

FIGS. 1 and 2 are diagrams illustrating a conventional method of forming a metal wiring;

FIGS. 3 to 7 are diagrams illustrating a method of forming a metal wiring in a semiconductor device in accordance with example embodiments of the present invention; and FIGS. 8 to 10 are diagrams illustrating a method of forming a metal wiring in a semiconductor device in accordance with example embodiments of the present invention.

DESCRIPTION OF THE EXAMPLE EMBODIMENTS

Figure 1:
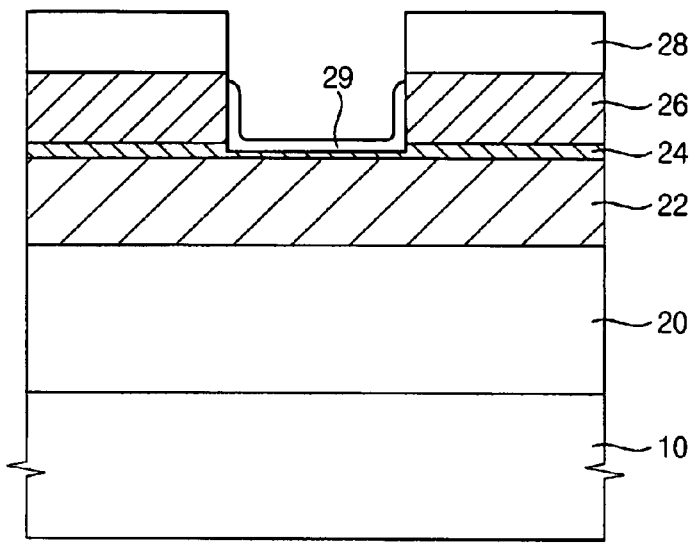
FIGS. 1 to 10 represent non-limiting, example embodiments of the present invention as described herein.
Figure 2:
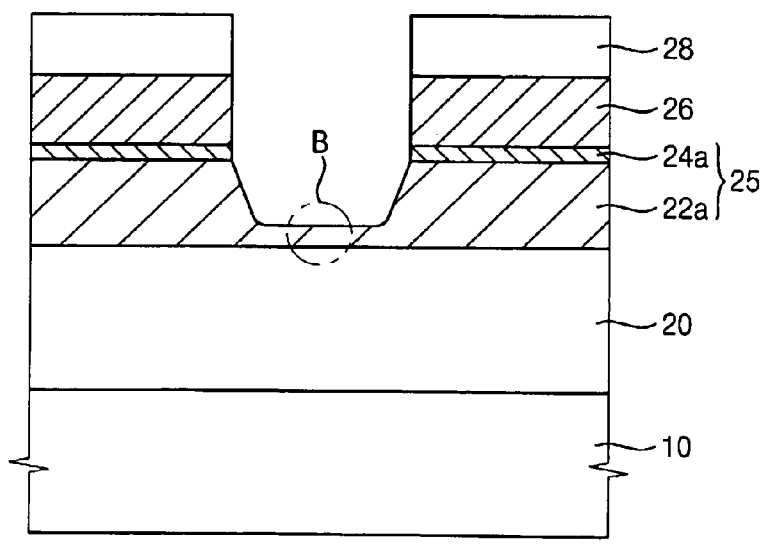

Various example embodiments of the present invention are described more fully hereinafter with reference to the accompanying drawings, in which example embodiments of the present invention are shown. Example embodiments of the present invention may, however, be embodied in many different forms and should not be construed as limited to the example embodiments of the present invention set forth herein. Rather, these example embodiments are provided so that this disclosure will be thorough and complete and will fully convey the scope of example embodiments of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the present invention.

Unless otherwise defined, all terms (including technical and scientific terms) used herein have the same meaning as commonly understood by one of ordinary skill in the art to which the example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention relate to a method of forming a metal wiring in a semiconductor device. Other example embodiments of the present invention relate to a method of forming a metal wiring in a semiconductor device without a generation of a bridge between adjacent metal wirings.

Figure 3:
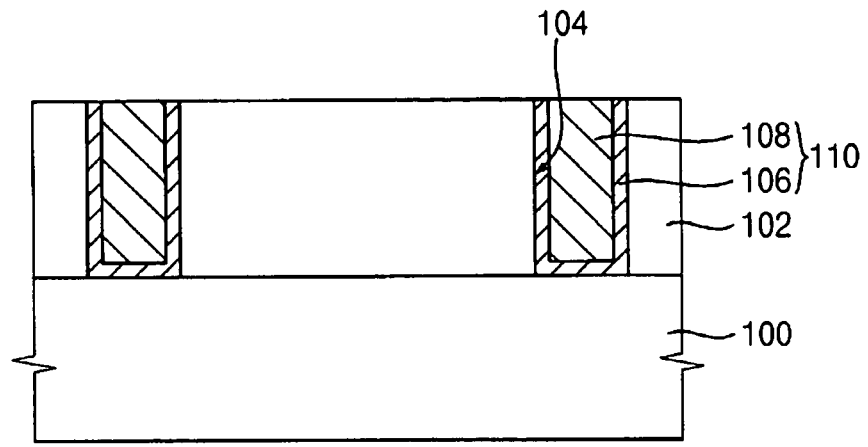

FIGS. 3 to 7 are diagrams illustrating a method of forming a metal wiring in a semiconductor device in accordance with example embodiments of the present invention. Referring to FIG. 3, an insulating interlayer 102 may be formed on a substrate 100. The insulating interlayer 102 may be formed using an oxide (e.g., silicon oxide and/or any other suitable oxide).

A lower structure (not shown) may be formed on the substrate 100. The lower structure may include a contact region, a transistor, a bit line, a word line, a plug and/or a pad. The insulating interlayer 102 may be formed on the substrate 100 to cover the lower structure. A contact hole 104 may be formed through the insulating interlayer 102 by partially etching the insulating interlayer 102. The contact hole 104 may be formed by a photolithography process. The contact hole 104 may expose a portion of the substrate 100 or the lower structure.

A first barrier metal layer may be formed on the exposed portion of the substrate 100, a sidewall of the contact hole 104 and the insulating interlayer 102. The first barrier metal layer may be formed using a metal (e.g., titanium (Ti), tantalum (Ta) and/or the like) or a metal nitride (e.g., titanium nitride (TiN), tantalum nitride (TaN) and/or the like). These may be used alone or in a mixture thereof.

In example embodiments of the present invention, the first barrier metal layer may have a multilayer structure in which at least one metal film and/or at least one metal nitride film may be sequentially or alternately formed.

A first metal layer may be formed on the first barrier metal layer to fill the contact hole 104. The first metal layer may be formed using a first metal (e.g., aluminum (Al), tungsten (W), copper (Cu) and/or any other suitable metal). Because the first metal layer including aluminum may not completely fill the contact hole 104 without a generation of a void therein, the first metal layer may be formed using tungsten or copper. The first metal layer and the first barrier metal layer may be partially removed until the insulating interlayer 102 is exposed. A contact 110 may be formed in the contact hole 104. The contact 110 may include a first barrier metal layer pattern 106 and a first metal layer pattern 108. The contact 110 may be formed by a chemical mechanical polishing (CMP) process and/or an etch back process.

Figure 4:
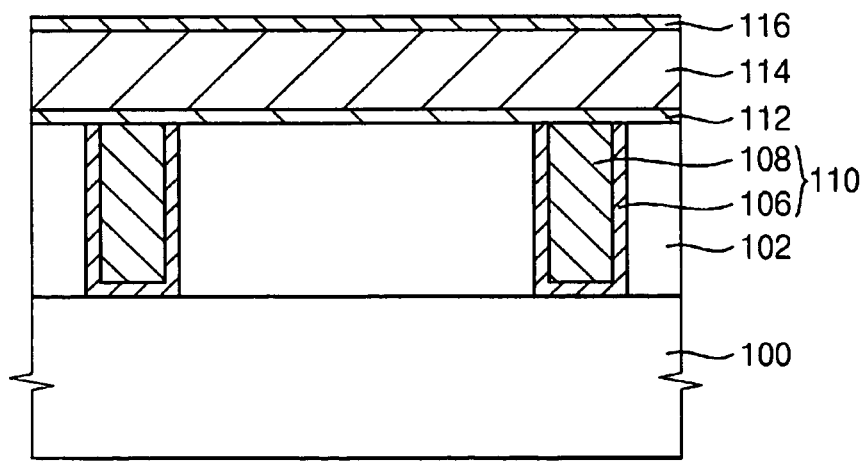

Referring to FIG. 4, a second barrier metal layer 112 may be formed on the contact 110 and the insulating interlayer 102. The second barrier metal layer 112 may retard, or prevent, metal atoms in a second metal layer 114 from diffusing into the insulating interlayer 102. The second barrier metal layer 112 may be formed using a metal (e.g., titanium, tantalum and/or the like) or a metal nitride (e.g., titanium nitride, tantalum nitride and/or the like). These may be used alone or in a mixture thereof. In example embodiments of the present invention, the second barrier metal layer 112 may include a titanium film and a titanium nitride film sequentially formed on the insulating interlayer 102 and the contact 110.

Figure 7:
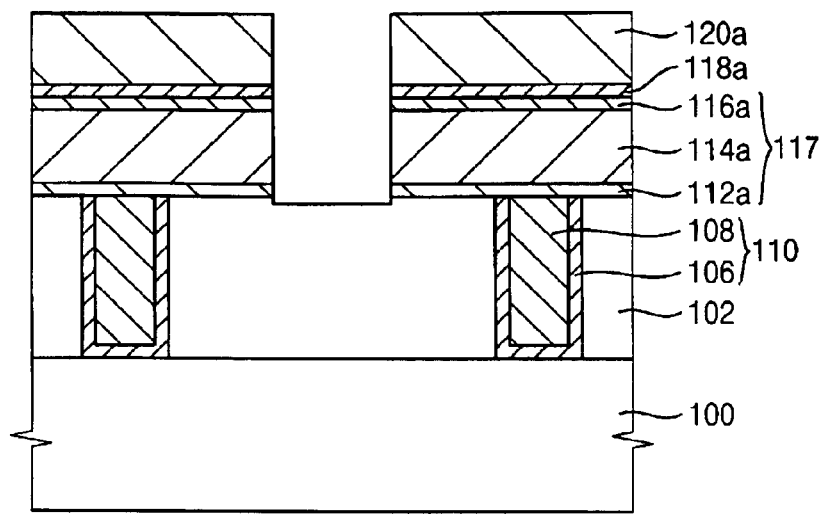

The second metal layer 114 may be formed on the second barrier metal layer 112 so as to form a metal wiring 117 (see FIG. 7). The second metal layer 114 may be formed using a second metal that may have a relatively low specific resistance. The second metal layer 114 may be etched by a reactive ion etching (RIE) process. For example, the second metal layer 114 may be formed using aluminum or tungsten. In example embodiments of the present invention, the second metal layer 114 may be formed using aluminum, which may have a specific resistance lower than that of tungsten. The second metal layer 114 may be formed by a physical vapor deposition (PVD) process (e.g., a sputtering process, an evaporation process, a pulsed laser deposition (PLD) process and/or any other suitable PVD process).

A third barrier metal layer 116 may be formed on the second metal layer 114. The third barrier metal layer 116 may be formed using a metal (e.g., titanium, tantalum and/or the like) or a metal nitride (e.g., titanium nitride, tantalum nitride and/or the like). These may be used alone or in a mixture thereof. In example embodiments of the present invention, the third barrier metal layer 116 may include a titanium film and a titanium nitride film successively formed on the second metal layer 114.

Figure 5:
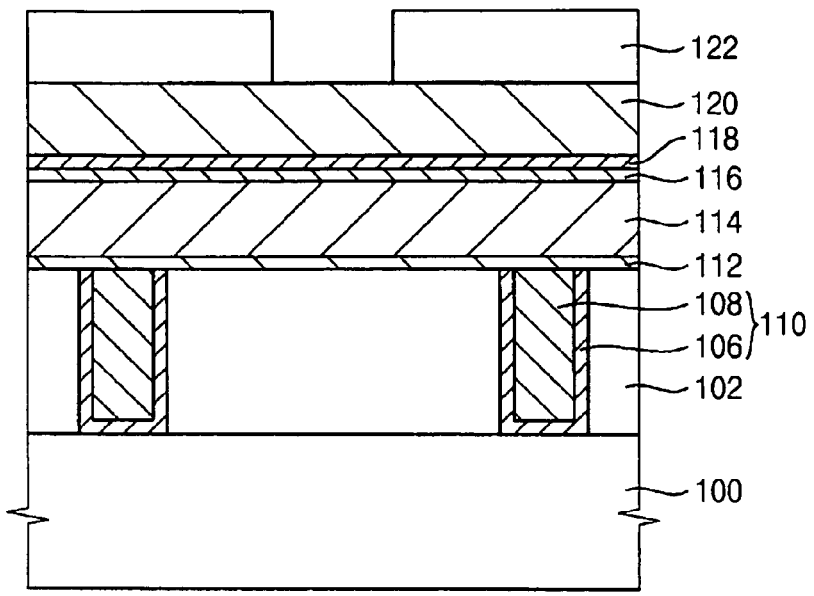

Referring to FIG. 5, a metal blocking layer 118 may be formed on the third barrier metal layer 116. The metal blocking layer 118 may be formed using a first material. The metal blocking layer 118 may protect the third barrier metal layer 116 in an etching process for forming a hard mask pattern 120a (see FIG. 6). The first material of the metal blocking layer 118 may be different from that of the third barrier metal layer 116. A hard mask layer 120 may be formed on the metal blocking layer 118. The hard mask layer 120 may be patterned to form the hard mask pattern 120a that serves as an etching mask for forming the metal wiring 117. The hard mask layer 120 may be formed using a second material substantially different from the first material of the metal blocking layer 118. The hard mask layer 120 may be formed from the second material that has a high etching selectivity relative to the second metal layer 114. The hard mask layer 120 may not be etched in an etching process for etching the second metal layer 114.

In example embodiments of the present invention, the hard mask layer 120 may include the second material that has an etching selectivity of about 5:1 relative to the first material of the metal blocking layer 118. The metal blocking layer 118 may not be consumed in an etching process for patterning the hard mask layer 120. In example embodiments of the present invention, the metal blocking layer 118 may include the first material that reflects a light having a wavelength different from that of a light reflected from the second material of the hard mask layer 120 while etching the hard mask layer 120. The etching process for patterning the hard mask layer 120 may be controlled using a wavelength difference between two lights reflected from the first and the second materials. An end point of the etching process for forming the hard mask pattern 120a may be accurately detected from the wavelength difference between the lights reflected from the first and the second materials.

In some example embodiments of the present invention, the first material of the metal blocking layer 118 may include silicon oxide, silicon nitride, silicon oxynitride, polysilicon and/or any other suitable material. The metal blocking layer 118 may be formed by a CVD process, a low pressure chemical vapor deposition (LPCVD) process, a plasma enhanced chemical vapor deposition (PECVD) process, a high density plasma-chemical vapor deposition (HDP-CVD) process and/or any other suitable process. The second material of the hard mask layer 120 may include silicon oxide, silicon nitride, silicon oxynitride, polysilicon and/or any other suitable material. The hard mask layer 120 may be formed may by a CVD process, an LPCVD process, a PECVD process, an HDP-CVD process and/or any other suitable process.

Silicon nitride and silicon oxynitride may be etched by substantially identical etch rates with respect to an etching solution or an etching gas containing fluorine (F). A light reflected from silicon nitride may also have a wavelength substantially the same as that of a light reflected from silicon oxynitride during an etching process using the etching gas including fluorine. The metal blocking layer 118 may be etched together with the hard mask layer 120 when the hard mask layer 120 and the metal blocking layer 118 include silicon nitride and silicon oxynitride, respectively. The end point of the etching process for etching the hard mask layer 120 may not then be accurately detected.

The following Table 1 shows the materials of the hard mask layer 120 and the metal blocking layer 118 in accordance with combination types I to IV.

TABLE 1

|  | Type I | Type II | Type III | Type IV |
|---|---|---|---|---|
| Hard mask layer | silicon oxide | silicon oxide | silicon oxide | silicon nitride |
| Metal blocking layer | silicon nitride | silicon oxynitride | polysilicon | silicon oxide |

The following Table 2 shows the materials of the hard mask layer 120 and the metal blocking layer 118 in accordance with combination types V to VII.

TABLE 2

|  | Type V | Type VI | Type VII | Type VIII |
|---|---|---|---|---|
| Hard mask layer | silicon nitride | polysilicon | Polysilicon | polysilicon |
| Metal blocking layer | polysilicon | silicon oxide | Silicon nitride | silicon oxynitride |

As shown Tables 1 and 2, the first material of the metal blocking layer 118 and the second material of the hard mask layer 120 may be selected among the combination types I to VIII except for a combination of silicon nitride and silicon oxynitride. In example embodiments of the present invention, the first material of the metal blocking layer 118 may include silicon nitride and the second material of the hard mask layer 120 may include silicon oxide.

Referring to FIG. 5, a photoresist film (not shown) may be formed on the hard mask layer 120. The photoresist film may be formed using a photoresist that is reacted with respect to a light having a wavelength of below about 193 nm. A photoresist pattern 122 having a width below about 90 nm may be obtained.

When the photoresist film is exposed to the light and developed, the photoresist pattern 122 may be formed on the hard mask layer 120. The photoresist pattern 122 may be formed on a portion of the hard mask layer 120 under which the contact 110 is positioned.

Figure 6:
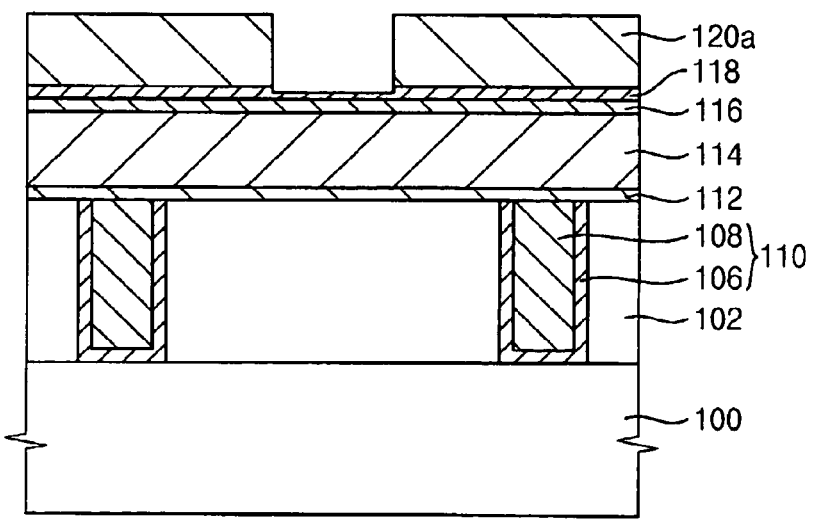

Referring to FIG. 6, the hard mask layer 120 may be patterned using the photoresist pattern 122 as an etching mask, thereby forming the hard mask pattern 120a on the metal blocking layer 118. When the hard mask layer 120 includes silicon oxide, the hard mask layer 120 may be etched using an etching gas that includes $C_4F_6$, $C_5F_8$, $C_4F_8$ and/or $CHF_3$. These may be used alone or in a mixture thereof. In example embodiments of the present invention, a pressure control gas may be introduced into a chamber where the substrate 100 is loaded during the etching process for forming the hard mask pattern 120a. The pressure control gas may include an inactive gas (e.g., an oxygen ($O_2$) gas and/or an argon (Ar) gas).

When the hard mask pattern 120a is formed on the metal blocking layer 118, a portion of the metal blocking layer 118 exposed by the hard mask pattern 120a may remain on the third barrier metal layer 116. The exposed portion of the metal blocking layer 118 may cover the third barrier metal layer 116 although the exposed portion of the metal blocking layer 118 is consumed in the etching process for forming the hard mask pattern 120a. The etching process for forming the hard mask pattern 120a may be stopped when the metal blocking layer 118 is exposed. To precisely control the etching process for forming the hard mask pattern 102a, a wavelength difference between a light reflected from the hard mask pattern 120a and a light reflected from the metal blocking layer 118 may be detected.

To avoid an exposure of the third barrier metal layer 116 after the formation of the hard mask pattern 120a, the etching process for forming the hard mask pattern 120a may be carried out using an etching solution or an etching gas that may have a high etching selectivity between the hard mask layer 120 and the metal blocking layer 118. The consumption of the exposed portion of the metal blocking layer 118 may be greatly reduced in the etching process for forming the hard mask pattern 120a. After the formation of the hard mask pattern 120a, the photoresist pattern 122 may be removed from the hard mask pattern 120a. The photoresist pattern 122 may be removed by an ashing process and/or a stripping process.

As described above, the third barrier metal layer 116 may not be exposed because the remaining portion of the metal blocking layer 118 covers the third metal layer 116 after the formation of the hard mask pattern 120a. Etched by-products (e.g., polymers) may not be generated in the etching process because the third barrier metal layer 116 may not react with photoresist and/or the etching gas or the etching solution. When the photoresist pattern 122 is formed using a photoresist that may react with the light having a wavelength of below about 193 nm, the polymers may be generated in the etching process if the third barrier metal layer 116 is exposed. According to example embodiments of the present invention, the polymers may not be generated in the etching process because the third barrier metal layer 116 is not exposed by the remaining portion of the metal blocking layer 118.

Referring to FIG. 7, the remaining portion of the metal blocking layer 118 may be formed using the hard mask pattern 120a as an etching mask, thereby forming a metal blocking layer pattern 118a on the third barrier metal layer 116. When the metal blocking layer pattern 118a is formed, a portion of the third barrier metal layer 116 may be exposed. When the hard mask pattern 120a is consumed in the etching process for forming the metal blocking layer pattern 118a, the hard mask pattern 120a may be continuously used as the etching mask in successive etching processes. The metal blocking layer pattern 118a may be formed using an etching gas and/or an etching solution that has a high etching selectivity between the metal blocking layer 118 and the hard mask pattern 120a. In some example embodiments of the present invention, the metal blocking layer pattern 118a may be formed using an etching gas (e.g., $CF_4$, $CHF_3$, $CH_2F_2$ and/or any other suitable gas) when the metal blocking layer 118 includes silicon nitride. These may be used alone or in a mixture thereof.

In example embodiments of the present invention, a pressure control gas may be introduced into a process chamber in which the substrate 100 is loaded so as to adjust the internal pressure of the process chamber during the etching process for forming the metal blocking layer pattern 118a. The pressure control gas may include an inactive gas (e.g., an oxygen gas and/or an argon gas).

Using the hard mask pattern 120a as the etching mask, the exposed portion of the third barrier metal layer 116 may be etched so that a third barrier metal layer pattern 116a is formed on the second metal layer 114. When the third barrier metal layer pattern 116a is formed, a portion of the second metal layer 114 may be exposed. In the etching process for forming the third barrier metal layer pattern 116a, the etched by-products (e.g., the polymers) may not be generated because the photoresist pattern 122 is already removed. In example embodiments of the present invention, the etching processes for forming the metal blocking layer pattern 118a and the third barrier metal layer pattern 116a may be carried out in-situ.

Referring to FIG. 7, the exposed portion of the second metal layer 114 may be exposed continuously using the hard mask pattern 120a as the etching mask. A second metal layer pattern 114a may be formed on the second barrier metal layer 112 and a portion of the second barrier metal layer 112 may be exposed by the second metal layer pattern 114a. When the second metal layer 114 includes aluminum, the second metal layer pattern 114a may be formed using an etching gas that includes $BCl_3$ and/or $Cl_2$. The exposed portion of the second barrier metal layer 112 may be etched using the hard mask pattern 120a as the etching mask, thereby forming a second barrier metal layer pattern 112a on the insulating interlayer 102 and the contact 110.

The metal wiring 117 having the second barrier metal layer pattern 112a, the second metal layer pattern 114a and the third barrier metal layer pattern 116a may be formed over the substrate 100. The metal blocking layer pattern 118a and the hard mask pattern 120a may be positioned on the metal wiring 117. To retard, or prevent, a failure, (e.g., a bridge) from generating between adjacent metal wirings 117, a portion of the second barrier metal layer 112 between the adjacent metal wirings 117 may be removed. The exposed portion of the second barrier metal layer 112 may be somewhat excessively etched so that a portion of the insulating interlayer 102 may be slightly etched in the formation of the second barrier metal layer pattern 112a.

The metal blocking layer pattern 118a and the hard mask pattern 120a may be removed from the metal wiring 117. Because the failure (e.g., the bridge) may not be generated between the adjacent metal wirings 117, the metal wiring 117 having a reduced width may be formed without the generation of an electrical short between the adjacent metal wirings 117.

Figure 8:
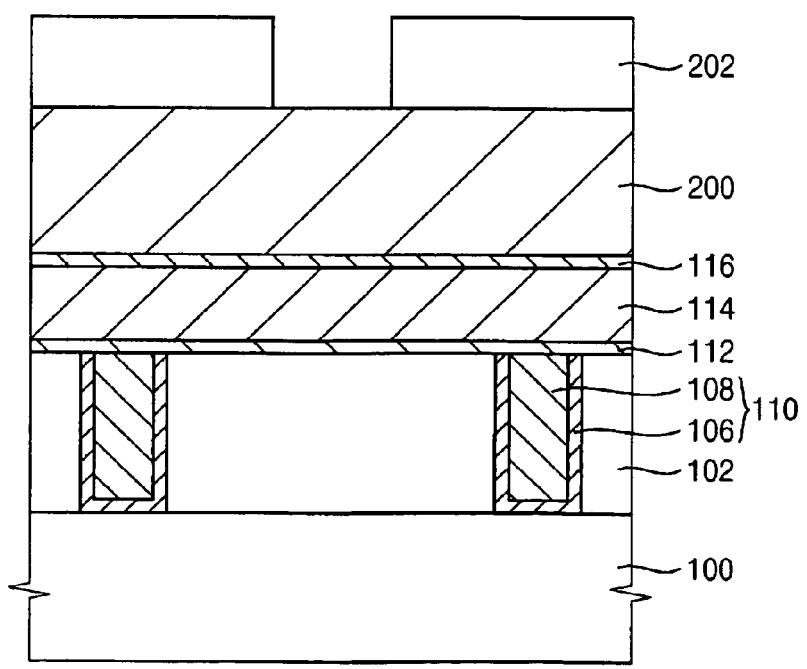
Figure 9:
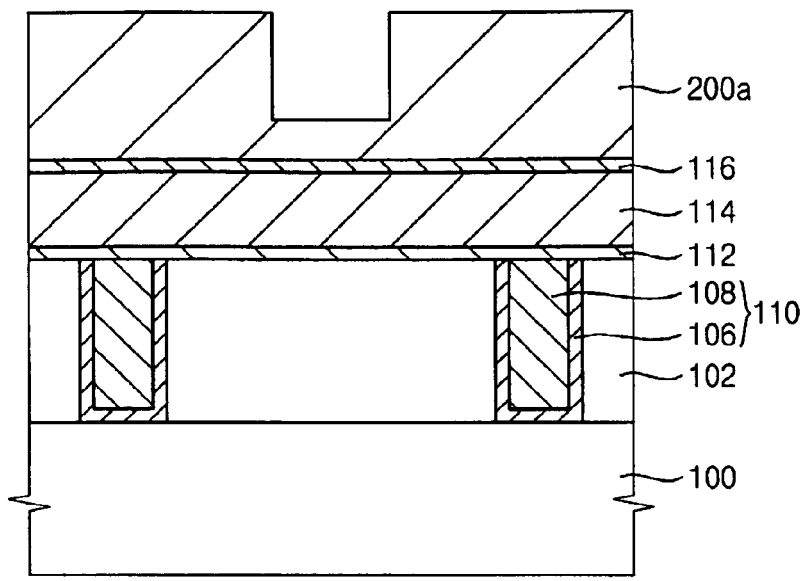
Figure 10:
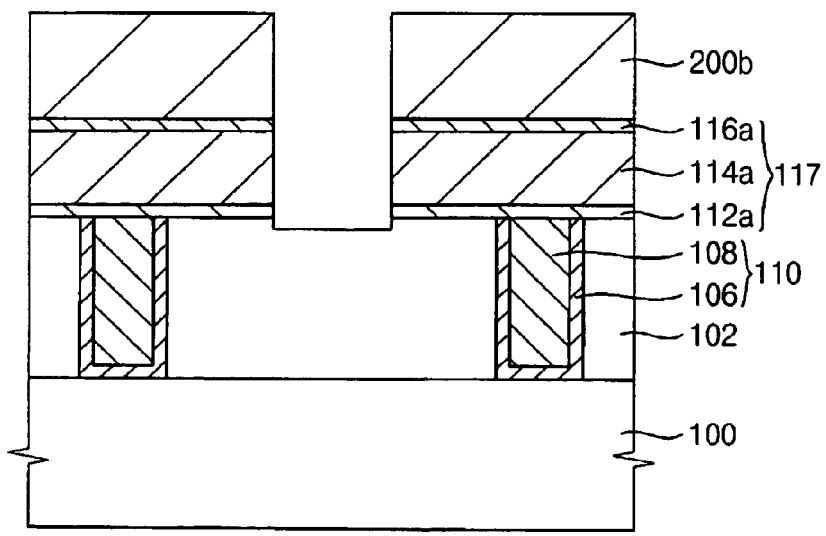

FIGS. 8 to 10 are diagrams illustrating a method of forming a metal wiring in a semiconductor device in accordance with example embodiments of the present invention. In FIGS. 8 to 10, the method of forming the metal wiring may be substantially the same as the method described with reference to FIGS. 3 to 7 except for the metal blocking layer 118.

Referring to FIG. 8, a contact 110 having a first barrier metal layer pattern 106 and a first metal layer pattern 108 may be formed through an insulating interlayer 102 formed on a substrate 100. A second barrier metal layer 112, a second metal layer 114 and a third barrier metal layer 116 may be sequentially formed on the contact 110 and the insulating interlayer 102.

A hard mask layer 200 may be formed on the third barrier metal layer 116. The hard mask layer 200 may be formed using a material that may have a high etching selectivity with respect to that of the second metal layer 114. The hard mask layer 200 may not be etched in an etching process for etching the second metal layer 114. The hard mask layer 200 may have a sufficient height based on the third barrier metal layer 116 to serve as the etching mask in successive etching processes. The hard mask layer 200 may be formed using silicon oxide, silicon nitride, silicon oxynitride, polysilicon and/or any other suitable material.

After a photoresist film is coated on the hard mask layer 200, the photoresist film may be exposed and developed to form a photoresist pattern 202 on the hard mask layer 200. The photoresist film may be formed using photoresist that may react with respect to a light having a wavelength of below about 193 nm. The photoresist pattern 202 may be positioned on a portion of the hard mask layer 200 under which the contact 110 is formed.

Referring to FIG. 9, the hard mask layer 200 may be partially etched using the photoresist pattern 202 as an etching mask to form a preliminary hard mask pattern 200a on the third barrier metal layer 116. When the preliminary hard mask layer 200a is formed, the third barrier metal layer 116 may not be exposed.

In example embodiments of the present invention, the preliminary hard mask pattern 200a may be formed using an etching gas that includes $C_4F_6$, $C_5F_8$, $C_4F_8$, $CHF_3$ and/or the like, when the hard mask layer 200 includes silicon oxide. These may be used alone or in a mixture thereof. In example embodiments of the present invention, a pressure control gas may be introduced into a process chamber where the substrate 100 is loaded in order to control an internal pressure of the process chamber during the etching process for forming the preliminary hard mask layer 200a. The pressure control gas may include an inactive gas (e.g., an oxygen gas and/or an argon gas).

Because the hard mask layer 200 is partially etched to form the preliminary hard mask layer 200a, the third barrier metal layer 116 may not be exposed. The hard mask layer 200 may have sufficient thickness so that the third barrier metal layer 116 is not exposed when the preliminary hard mask pattern 200a is formed. The photoresist pattern 202 may be removed from the preliminary hard mask pattern 200a. The photoresist pattern 202 may be removed by an ashing process and/or a stripping process.

Etched by-products (e.g., polymers) may not be generated in the etching process for forming the preliminary hard mask pattern 200a because the third barrier metal layer 116 may not be exposed when the preliminary hard mask pattern 200a is formed. When the photoresist pattern 202 includes photoresist that may react relative to the light having the wavelength below about 193 nm, the polymers may be generated by a reaction between photoresist and metal in the third barrier metal layer 116 if the third barrier metal layer 116 is exposed. According to some example embodiments of the present invention, the third barrier metal layer 116 may not be exposed in the formation of the preliminary hard mask pattern 200a so that the etched by-products (e.g., polymers) may not be generated in the etching process for forming the preliminary hard mask pattern 200a.

Referring to FIG. 10, the preliminary hard mask pattern 200a may be etched to form a hard mask pattern 200b on the third barrier metal layer 116. The hard mask pattern 200b may partially expose the third barrier metal layer 116. The hard mask pattern 200b may be formed by an anisotropic etching process.

The hard mask pattern 200b may be formed without using any etching mask so that stepped portions of the preliminary hard mask pattern 200a may be effectively removed in the formation of the hard mask pattern 200b. The hard mask pattern 200b may have a thickness smaller than the hard mask layer 200. The hard mask layer 200 may have sufficient thickness considering the resulting thickness of the hard mask layer 200b. The hard mask pattern 200b may serve as the etching mask for forming a metal wiring 117.

The exposed portion of the third barrier metal layer 116 may be etched using the hard mask pattern 200b as the etching mask to thereby form a third barrier metal layer pattern 116a on the second metal layer 114. The third barrier metal layer pattern 116a may expose a portion of the second metal layer 114. In the formation of the third barrier metal layer pattern 116a, the polymers may not be generated because the photoresist pattern 202 has been removed.

In example embodiments of the present invention, the etching processes for forming the hard mask pattern 200b and the third barrier metal layer pattern 116a may be carried out in-situ. The exposed portion of the second metal 114 may be etched continuously using the hard mask pattern 200b as the etching mask. A second metal layer pattern 114a exposing a portion of the second barrier metal layer 112 may be formed. When the second metal layer 114 includes aluminum, the second metal layer pattern 114a may be formed using an etching gas that includes $BCl_3$ and/or $Cl_2$.

Using the hard mask pattern 200b as the etching mask, the exposed portion of the second barrier metal layer 112 may be etched to form a second barrier metal layer pattern 112a on the insulation layer 102 and the contact 110. The metal wiring 117 having the second barrier metal layer pattern 112a, the second metal layer pattern 114a and the third barrier metal layer pattern 116a may be formed over the substrate 100. The hard mask pattern 200b may be positioned on the metal wiring 117.

In order to retard, or prevent, a generation of a failure (e.g., a bridge) between adjacent metal wirings 117, a portion of the second barrier metal layer 112 between the adjacent metal wirings 117 may be removed. The exposed portion of the second barrier metal layer 112 may be etched so that the insulating interlayer 102 may be slightly etched in the formation of the second barrier metal layer pattern 112a. In example embodiments of the present invention, the hard mask pattern 200b may be removed from the metal wiring 117.

The metal wiring 117 having a reduced width may be formed without a generation of an electrical short between the adjacent metal wirings 117. The semiconductor device, including the metal wiring 117, may have improved reliability without an electrical failure thereof.

According to example embodiments of the present invention, a failure (e.g., a bridge) frequently generated between adjacent metal wirings may be effectively reduced by retarding, or preventing, the reaction between etched by-products and at least one barrier metal layer. The metal wiring having a reduced width may be obtained without a failure thereof. A semiconductor device may have improved reliability and electrical characteristics when the metal wiring according to example embodiments of the present invention is employed in the semiconductor device.

The foregoing is illustrative of example embodiments of the present invention and is not to be construed as limiting thereof. Although a few example embodiments of the present invention have been described, those skilled in the art will readily appreciate that many modifications are possible in the example embodiments without materially departing from the novel teachings and advantages of example embodiments of the present invention. Accordingly, all such modifications are intended to be included within the scope of example embodiments of the present invention as defined in the claims. In the claims, means-plus-function clauses are intended to cover the structures described herein as performing the recited function and not only structural equivalents but also equivalent structures. Therefore, it is to be understood that the foregoing is illustrative of example embodiments of the present invention and is not to be construed as limited to the specific embodiments disclosed and that modifications to the disclosed embodiments, as well as other embodiments, are intended to be included within the scope of the appended claims. Example embodiments of the present invention is defined by the following claims, with equivalents of the claims to be included therein.

What is claimed is:

1. A method of forming a metal wiring in a semiconductor device, comprising:

forming at least one metal layer on a substrate;

forming at least one barrier metal layer on the at least one metal layer;

forming a metal blocking layer on the at least one barrier metal layer;

forming a hard mask layer on the metal blocking layer;

forming a hard mask pattern on the metal blocking layer by partially etching the hard mask layer, without an exposure of the at least one barrier metal layer;

forming a metal blocking layer pattern on the at least one barrier metal layer by partially etching the metal blocking layer using the hard mask pattern as an etching mask; and forming the metal wiring having at least one barrier metal layer pattern and at least one metal layer pattern on the substrate by partially etching the at least one barrier metal layer and the at least one metal layer using the hard mask pattern as an etching mask.

2. The method of claim 1, wherein forming the hard mask pattern further comprises:
   forming a photoresist pattern on the hard mask layer; and
   forming the hard mask pattern by partially etching the hard mask layer using the photoresist pattern as an etching mask.

3. The method of claim 2, prior to forming the metal blocking layer pattern, further comprising:
   removing the photoresist pattern from the hard mask pattern.

4. The method of claim 2, wherein the photoresist pattern includes a photoresist reacting on a light having a wavelength below about 193 nm.

5. The method of claim 2, wherein forming the hard mask pattern further comprises:
   detecting an end point of etching the hard mask layer using a wavelength difference between a light reflected from the hard mask layer and a light reflected from the metal blocking layer.

6. The method of claim 2, wherein the hard mask pattern is formed using an etching gas that has an etching selectivity of about 5:1 between the hard mask layer and the metal blocking layer.

7. The method of claim 6, wherein the etching gas includes at least one selected from the group including $C_4F_6$, $C_5F_8$, $C_4F_8$ and $CHF_3$.

8. The method of claim 1, further comprising:
   removing the hard mask pattern and the metal blocking layer pattern after forming the metal wiring.

9. The method of claim 1, wherein the metal blocking layer is formed using a first material and the hard mask layer is formed using a second material different from the first material.

10. The method of claim 9, wherein the first material and the second material include any one selected from the group including silicon oxide, silicon nitride, silicon oxynitride and polysilicon.

11. The method of claim 1, wherein the at least one metal layer is formed using aluminum, tungsten or copper.

12. The method of claim 1, wherein the at least one barrier metal layer is formed using at least one selected from the group including titanium, tantalum, titanium nitride and tantalum nitride.

13. The method of claim 1, prior to forming the at least one metal layer, further comprising:
   forming an additional barrier metal layer on the substrate.

14. The method of claim 13, wherein the additional barrier metal layer is formed using at least one selected from the group including titanium, tantalum, titanium nitride and tantalum nitride.

15. The method of claim 1, prior to forming the at least one metal layer, further comprising:
   forming an isolation layer on the substrate; and
   forming a contact through the isolation layer.

16. The method of claim 1, further comprising:
   forming the hard mask layer on the at least one barrier metal layer;
   forming a photoresist pattern on the hard mask layer;
   forming a preliminary hard mask pattern on the at least one barrier metal layer by partially etching the hard mask layer using the photoresist pattern as an etching mask, wherein the preliminary hard mask pattern covers the at least one barrier metal layer; and
   forming a hard mask pattern on the at least one barrier metal layer by partially etching the preliminary hard mask pattern.

17. The method of claim 16, prior to forming the hard mask pattern, further comprising:
   removing the photoresist pattern from the preliminary hard mask pattern.

18. The method of claim 16, wherein the hard mask layer includes a material that has an etching selectivity relative to the at least one metal layer.

19. The method of claim 1, prior to forming the at least one barrier metal layer, further comprising:
   forming a lower structure on a substrate;
   forming an insulating interlayer on the substrate to cover the lower structure;
   forming a contact hole through the insulating interlayer by partially etching the insulating interlayer, exposing a portion of the substrate or the lower structure.

20. The method of claim 19, wherein the lower structure includes any one selected from the group including contact region, a transistor, a bit line, a word line, a plug and a pad.

* * * * *